United States Patent
Botti

(10) Patent No.: US 12,081,121 B2
(45) Date of Patent: Sep. 3, 2024

(54) AUDIO ELECTRONIC SYSTEM WITH SWITCHING CONVERTER

(71) Applicant: STMicroelectronics S.r.l., Agrate Brianza (IT)

(72) Inventor: Edoardo Botti, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/310,824

(22) Filed: May 2, 2023

(65) Prior Publication Data
US 2023/0268830 A1  Aug. 24, 2023

Related U.S. Application Data

(62) Division of application No. 17/313,505, filed on May 6, 2021, now Pat. No. 11,671,009.

(30) Foreign Application Priority Data

Jun. 24, 2020 (IT) .................. 102020000015232

(51) Int. Cl.
| | |
|---|---|
| H02M 3/158 | (2006.01) |
| H02M 3/155 | (2006.01) |
| H03F 3/217 | (2006.01) |
| H04R 3/04 | (2006.01) |

(52) U.S. Cl.
CPC ............ H02M 3/155 (2013.01); H03F 3/217 (2013.01); H04R 3/04 (2013.01); *H03F 2200/03* (2013.01)

(58) Field of Classification Search
CPC ....... H02M 3/155; H02M 3/158; H03F 3/217; H03F 3/127
See application file for complete search history.

(56) References Cited

U.S. PATENT DOCUMENTS

| | | | | |
|---|---|---|---|---|
| 7,345,893 | B2 | 3/2008 | Boldo | |
| 9,882,543 | B2* | 1/2018 | Mohammadpour | .... H03F 1/565 |
| 11,159,132 | B2* | 10/2021 | Coric | ......... H03F 3/68 |
| 2006/0006933 | A1* | 1/2006 | Nguyen | .......... H03F 3/181 |
| | | | | 330/10 |

(Continued)

FOREIGN PATENT DOCUMENTS

| | | | | |
|---|---|---|---|---|
| CA | 2616220 | A1 * | 2/2007 | ............ H03F 3/217 |
| CN | 104967313 | A | 10/2015 | |

(Continued)

*Primary Examiner* — Sisay G Tiku
(74) *Attorney, Agent, or Firm* — Slater Matsil, LLP

(57) ABSTRACT

An audio electronic system includes a DC switching converter comprising first and second Zeta converters, each comprising an input stage, an output stage, a first switching stage, and a second switching stage. The input stage of each Zeta converter comprises a respective input inductor having a first terminal electrically coupled to the respective first switching stage. The input inductors of the input stages of the first and second Zeta converters are magnetically coupled in such a way that when current enters the terminal of the input inductor of the first Zeta converter that is coupled to the first switch stage of the first Zeta converter, a voltage induced by the coupled current is positive at the terminal of the input inductor of the second Zeta converter that is coupled to the first switching stage of the second Zeta converter.

18 Claims, 6 Drawing Sheets

(56) References Cited

U.S. PATENT DOCUMENTS

| | | |
|---|---|---|
| 2006/0012348 A1 | 1/2006 | Zhao et al. |
| 2006/0132234 A1 | 6/2006 | Nguyen |
| 2015/0115926 A1 | 4/2015 | Song et al. |
| 2015/0188437 A1 | 7/2015 | Chan |
| 2016/0211759 A1 | 7/2016 | Luccato |
| 2017/0012594 A1 | 1/2017 | Westmoreland |
| 2017/0302176 A1 | 10/2017 | Leong |
| 2019/0221360 A1 | 7/2019 | Abe et al. |
| 2020/0021256 A1 | 1/2020 | Terwal et al. |
| 2020/0091877 A1 | 3/2020 | Goto et al. |
| 2021/0296988 A1 | 9/2021 | Botti |

FOREIGN PATENT DOCUMENTS

| | | |
|---|---|---|
| JP | WO2018211698 A1 | 3/2020 |
| KR | 20170006394 A | 1/2017 |
| WO | 2017141025 A1 | 8/2017 |
| WO | 2018158556 A1 | 9/2018 |
| WO | 2020014378 A1 | 1/2020 |
| WO | 2020146591 A1 | 7/2020 |

\* cited by examiner

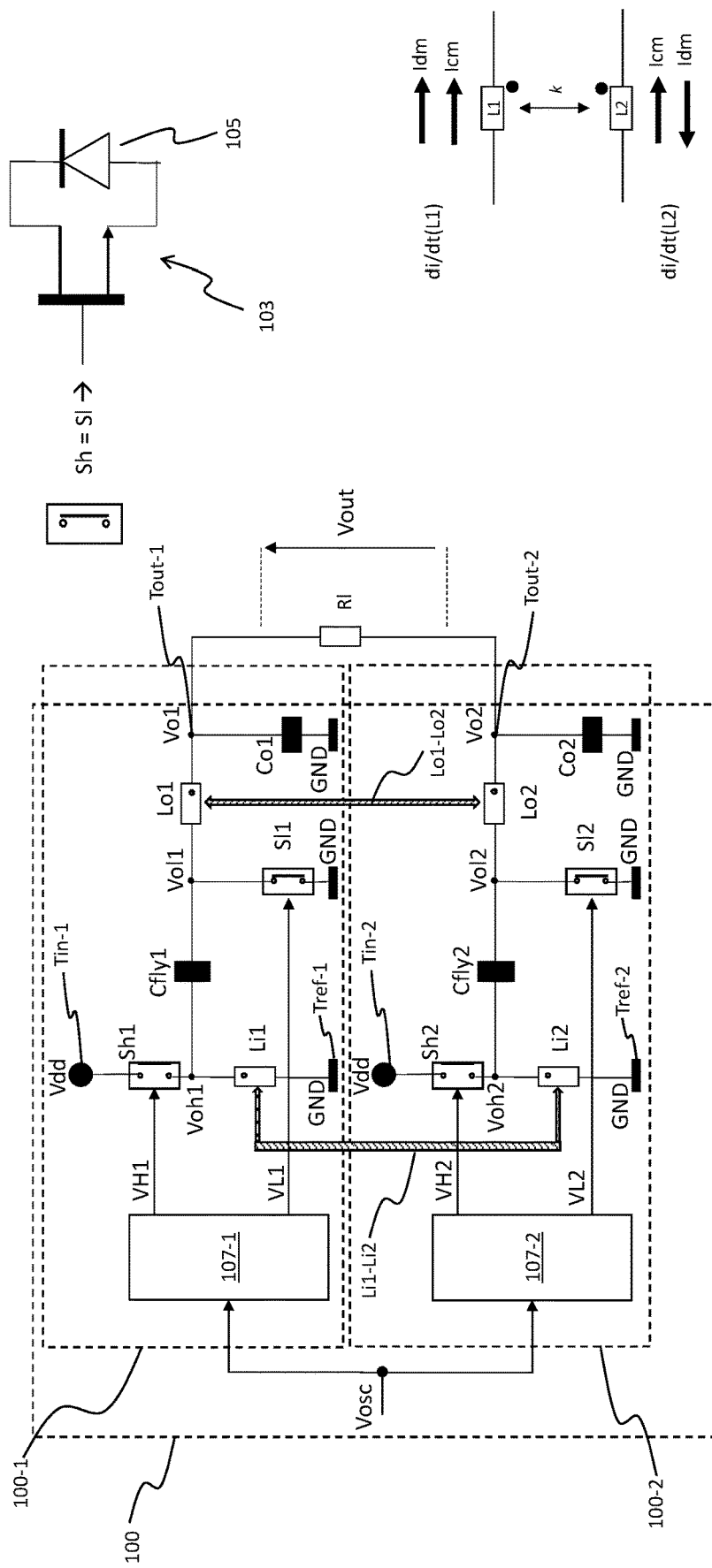

AUDIO ELECTRONIC SYSTEM WITH SWITCHING CONVERTER

CROSS-REFERENCE TO RELATED APPLICATIONS

This application is a divisional application of U.S. patent application Ser. No. 17/313,505, filed May 6, 2021, which claims the priority benefit of Italian Patent Application No. 102020000015232, filed on Jun. 24, 2020, all of which applications are hereby incorporated herein by reference.

TECHNICAL FIELD

The present disclosure generally relates to the field of switching converters. Particularly, the present disclosure relates to DC-DC switching converters, a type of electronic power converters used for converting a direct current (DC) input voltage into a direct current (DC) output voltage of value generally different from the DC input voltage value, i.e., for converting a DC source from one voltage level to another. More particularly, the present disclosure relates to a switching converter, wherein the DC output voltage is lower or higher than the DC input voltage depending on a duty cycle of an oscillating signal, such as a Zeta converter.

BACKGROUND

DC-DC switching converters may be used in any electronic system comprising a power source (such as a battery) and one or more electronic/electro-mechanic components each one operating at a respective voltage: in such an electronic system the DC-DC switching converter may be configured to generate multiple controlled output voltages from the (single) input voltage provided by the power source.

This for example allows saving space, in that the use of multiple power sources within the electronic system to supply different components thereof is avoided.

Recently, Zeta converters have been developed, in which the output voltage is lower or higher than the input voltage depending on a duty cycle of an oscillating signal (typically, a square-wave signal).

A conventional Zeta converter comprises an inductive (or inductive-capacitive) input stage for receiving the DC input voltage, an inductive (or inductive-capacitive) output stage for providing the DC output voltage, a capacitive coupling stage for coupling the input stage and the output stage to each other, a high-side switch and a low-side switch.

Under the control of the oscillating signal, the high-side switch is configured to be switched between first (or ON) and second (or OFF) states in which the DC input voltage is delivered and, respectively, prevented from being delivered to the input stage, and the low-side switch is configured to be switched between first (or ON) and second (or OFF) states in which a reference voltage is delivered and, respectively, prevented from being delivered to the output stage.

Advantages of Zeta converters over classic buck/boost converters are the polarity of the DC output voltage, which is positive with respect to a circuit reference voltage, and the reduce DC output voltage ripple, due to the inductive-capacitive output stage that forms a low-pass filter. The DC output voltage is proportional to the DC input voltage, with a proportionality factor given by $D/(1-D)$, with D indicating the duty cycle of the (square-wave) oscillating signal. For values of the duty cycle D in the range from 0 and 0.5, the value of the DC output voltage is less than or equal to the DC input voltage value; for values of the duty cycle D higher than 0.5, the value of the DC output voltage is higher than the DC input voltage value. For a proper operation of the Z converter, the value of the duty cycle D should not exceed about 0.75.

In cases the load needs a voltage of both positive and negative polarity, two Z converters connected in a bridge configuration to the load can be exploited. In that case, the voltage across the load is given by the difference between the DC output voltages of the two Z converters, each of which depends, as mentioned above, on the duty cycle of the respective oscillating signal.

SUMMARY

The major criticality for the dissipation of the Zeta converter is when the converter operates in boost condition (i.e., with duty cycle D of the oscillating signal higher than 0.5), during the transient when the voltage at the circuit node between the high-side switch and the input stage, below the reference voltage due to the direction of the current, passes to the maximum positive value. This transition is governed by the switching off of the low-side switch and the switching on of the high-side switch. In these conditions, the voltage across the high-side switch is equal to the DC input voltage plus the (absolute value of the) negative voltage at the circuit node between the high-side switch and the input stage. The DC output voltage starts rising when peak current flowing through the high-side switch equals the peak current flowing through the low-side switch.

In case (as frequently happens in implementations of the Z converter as an integrated circuit) the high-side switch and the low-side switch comprises FET transistors (e.g., MOSFETs) that have an intrinsic pn diode across the drain and source electrodes, which intrinsic diode is in forward biasing condition during the transient due to the reverse recovery time, the current that runs through the high-side switch can, for a period of time, be 2-3 times the peak current flowing through the low-side switch, and this further increases the instantaneous dissipated power.

In practical implementations, the power dissipated by the high-side switch during this transient can reach 500 W.

In view of the above, the Applicant has tackled the problem of devising a solution to the abovementioned problems.

The Applicant has found that the use of magnetically coupled inductors for the input stages of the two Z converters connected in a bridge configuration to a load provides significant advantages.

According to an aspect of the solution disclosed in the present document, a switching converter is provided for converting a direct current input voltage into a direct current output voltage. The switching converter comprises a first Zeta converter and a second Zeta converter having respective output terminals configured to be connected to a load.

Each one of the first and second Zeta converters comprises: an input stage for receiving the input voltage; an output stage for providing a respective output voltage to the load; a first switching stage configured to be switched between a first state in which the input voltage is allowed to be provided to the input stage, and a second state in which the input voltage is prevented from being provided to the input stage; and a second switching stage configured to be switched between a first state in which a reference voltage is allowed to be provided to the output stage, and a second state in which the reference voltage is prevented from being provided to the output stage.

The input stage of each Zeta converter comprises a respective input inductor having a first terminal electrically coupled to the respective first switching stage. The input inductors of the input stages of the first and second Zeta converters are magnetically coupled inductors, magnetically coupled in such a way that when current enters the terminal of the input inductor of the first Zeta converter that is coupled to the first switch stage of the first Zeta converter, a voltage induced by the coupled current is positive at the terminal of the input inductor of the second Zeta converter that is coupled to the first switching stage of the second Zeta converter.

In embodiments, the output stage of each Zeta converter may comprise a respective output inductor. The output inductors of the output stages of the first and second Zeta converters may be magnetically coupled inductors, magnetically coupled in such a way that if current enters a terminal of the output inductor of the first Zeta converter that is coupled to the output terminal of the first Zeta converter, a voltage induced by the coupled current is positive at the terminal of the output inductor that is coupled to the output terminal of the second Zeta converter.

In embodiments, the input inductors of the input stages of the first and second Zeta converters may be loosely magnetically coupled inductors.

In embodiments, the output inductors of the output stages of the first and second Zeta converters may be loosely magnetically coupled inductors.

In embodiments, the loosely magnetically coupled inductors may have a coupling coefficient of about 0.7.

In embodiments, the first switching stage and the second switching stage of the first and second Zeta converters may comprise FETs (103).

According to another aspect of the solution disclosed in the present documents, an electronic system is provided, comprising a DC power source, a switching converter (100) in accordance with any of the preceding claims, and a load. The switching converter receives a DC input voltage from the DC power source and drives the load.

In particular, the electronic system may comprise a class D audio power amplifier.

Thanks to the solution proposed in the present disclosure, the space occupation of systems comprising Zeta converters connected in bridge configuration is reduced. In fact, by exploiting the properties of magnetically coupled inductors, and by properly coupling the pair of input inductors of the input stages and/or the pair of output inductors of the output stages of the first and second Zeta converters (where, by "properly coupling" it is meant coupling the two inductors of the magnetically coupled inductor pairs so as to respect a specific polarity), it is possible to achieve performances equal to or better than those achievable with separated (i.e., not magnetically coupled) inductor pairs, and with a significantly reduced space occupation. In particular, the use of magnetically coupled inductors for the pair of input inductors of the input stages of the two Zeta converters allows reducing the dissipated power caused by the critical transient discussed in the foregoing.

BRIEF DESCRIPTION OF THE DRAWINGS

The features and advantages of the solution proposed in the present disclosure, as well as other features and advantages, will appear more clearly by reading the following detailed description of exemplary and non-limitative embodiments of the proposed solution. For a better intelligibility, the following description should be read making reference to the annexed figures, wherein:

FIG. 1 shows the circuit schematic of an arrangement of two Zeta converters connected in bridge configuration to a load, with magnetically coupled inductors, in accordance with an embodiment of the solution proposed in the present disclosure;

FIG. 2 schematizes two magnetically coupled inductors;

DETAILED DESCRIPTION OF ILLUSTRATIVE EMBODIMENTS

Figure 3:
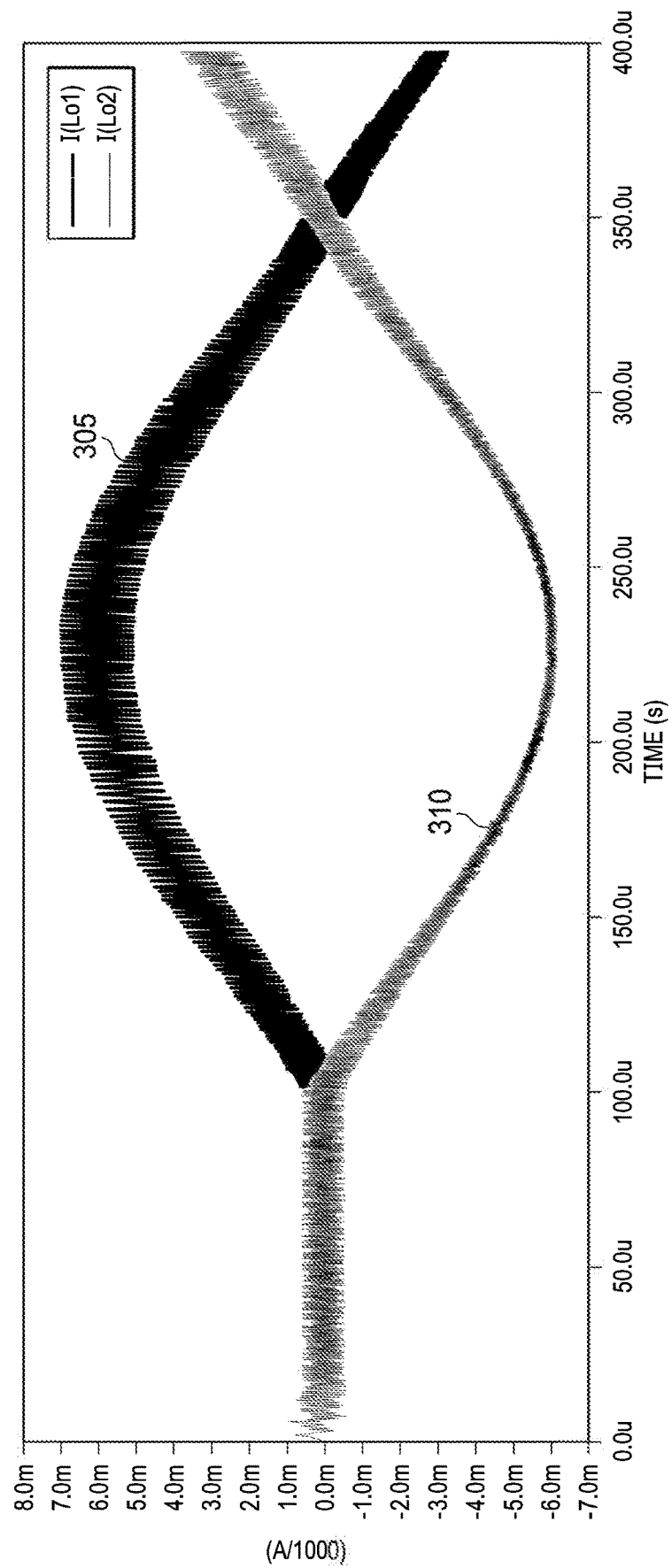
FIG. 3 is a comparative diagram showing curves of currents flowing through output inductors of the two Zeta converters of FIG. 1, resulting from simulations.

With reference to the annexed figures, FIG. 1 shows the circuit schematic of a conventional arrangement of a switching converter (enclosed in the dashed rectangle and indicated as boo), particularly a switching DC-DC converter comprising two Zeta converters (in the following referred to as first and second Zeta converters) 100-1 and 100-2 connected in bridge configuration to a load Rl.

Each one of the first and second Zeta converters 100-1 and 100-2 is a DC-DC switching converter, configured to convert a direct current (DC) input voltage Vdd into a respective direct current (DC) output voltage V01, V02 generally different from the DC input voltage Vdd and being lower or higher than the DC input voltage Vdd depending on a duty cycle of an oscillating signal VH1, VL1 and, respectively, VH2, VL2, as discussed in the following.

Each one of the first and second Zeta converters 100-1, 100-2 comprises a respective input terminal Tin-1, Tin-2 which, in operation, receives an input voltage, particularly a DC input voltage Vdd, and a respective output terminal Tout-1, Tout-2 which, in operation, provides a respective output voltage, particularly a respective DC output voltage V01, V02. In use, the output terminal Tout-1 of the first Zeta converter 100-1 can be electrically coupled to one terminal or electrode of the load Rl, while the output terminal Tout-2 of the second Zeta converter 100-2 can be electrically coupled to another terminal or electrode of the load Rl. The load Rl can be schematized as a resistive load, but this should not be construed as limitative.

According to an embodiment, each one of the first and second Zeta converters 100-1, 100-2 comprises a respective first switching stage (for example, a first switching element) Sh1, Sh2, hereinafter referred to as high-side switch, and a respective second switching stage (for example, a second switching element) Sl1, Sl2, hereinafter referred to as low-side switch. In the following, the high-side switch Sh1, Sh2 and the low-side switch Sl1, Sl2 of the first or second Zeta converters 100-1, 100-2 will sometimes be also concisely referred to as switches Sh1, Sl1, or switches Sh2, Sl2, when distinguishing between the high-side switch Sh1, Sh2 and the low-side switch Sl1, Sl2 is not relevant for the understanding of the exemplary embodiment being described.

In the circuit schematic of FIG. 1 the switches Sh1, Sl1, Sh2, Sl2 are illustrated by a same, generic representations, in that their specific implementations are not relevant for the understanding of the present invention. For example, as shown in detail at the top-right part of the drawing sheet of FIG. 1, the switches Sh1, Sl1, Sh2, Sl2 can be implemented as Field Effect Transistors (FETs) 103, with a control terminal or gate terminal, a first conduction terminal or drain terminal and a second conduction terminal or source terminal—the detail also shows the intrinsic pn diode (body diode) 105 intrinsically associated with the FET. For example, the high-side switches Sh1, Sh2 comprises a PMOS FET transistor, and the low-side switches Sl1, Sl2 comprises an NMOS FET transistor.

According to an embodiment, each switch Sh1, Sl1, Sh2, Sl2 comprises a switch control terminal (in the exemplary FET implementation of the switches, the switch control terminal is the gate terminal of the FET) for receiving a respective switch control signal VH1, VL1, VH2, VL2, and first and second switch conduction terminals (in the exemplary FET implementation of the switches, the switch conduction terminals are the drain terminal and the source terminal of the FET) electrically coupleable to each other according to a value of (i.e., taken by) the respective switch control signal VH1, VL1, VH2, VL2.

According to an embodiment, each switch control signal VH1, VL1, VH2, VL2 is a digital signal, i.e. a two-valued (voltage) signal that may take a low logic level (for example corresponding to a reference or ground voltage, such as 0 V) and a high logic level (for example, corresponding to a positive voltage higher than the reference voltage, such as 3.4 V. For example, the value of the positive voltage corresponding to the high logic level can be equal to the value of the input voltage Vdd).

According to an embodiment, the switch control signals VH1, VlA, VH2 and VL2 are generated from an oscillating signal Vosc. According to an embodiment, the oscillating signal Vosc is a square-wave signal with duty cycle D. According to an embodiment, the duty cycle D of the oscillating signal Vosc can be varied dynamically so as to accordingly vary a voltage conversion factor (V01/Vdd, V02/Vdd) of the switching converter 100.

According to an embodiment, the switching converter boo comprises a control module (for example, a microcontroller), configured to receive the oscillating signal Vosc. In the shown example, each one of the first and second Zeta converters 100-1, 100-2 has its own control module 107-1, 107-2, each of which is configured to receive the oscillating signal Vosc (the two control modules 107-1 and 107-2 can be implemented by a same microcontroller, unique for the switching converter 100). The control module 107-1 generates the switch control signals VH1, VL1 for the switches Sh1, Sl1 of the first Zeta converter 100-1, the control module 107-2 generates the switch control signals VH2, VL2 for the switches Sh2, Sl2 of the second Zeta converter 100-2.

According to an embodiment, depending on the value of the respective switch control signal VH1, VL1, VH2, VL2, each switch Sh1, Sl1, Sh2, Sl2 may take an electrically closed or ON state in which the respective first and second switch conduction terminals are electrically coupled to each other (thus allowing an electric current to flow across the switch), and an electrically open or OFF state in which the respective first and second switch conduction terminals are electrically decoupled from each other (thus preventing any significant electric current to flow across the switch).

According to an embodiment, the switch control signals VH1, VlA, VH2, VL2, are generated by the control modules 107-1 and 107-2 of the first and second Zeta converters 100-1, 100-2 in such a way that the high-side switch Sh1 and the low-side switch Sl1 of the first Zeta converter 100-1, and the high-side switch Sh2 and the low-side switch Sl2 of the second Zeta converter 100-2, are not both in the ON state. The switch control signals VH1 and VlA the high-side switch Sh1 and the low-side switch Sl1 of the first Zeta converter 100-1, and the switch control signals VH2 and VL2 the high-side switch Sh2 and the low-side switch Sl2 of the second Zeta converter 100-2, can be mutually inverted square-wave signals, i.e. square-wave signals which phase shifted by 180° from each other (for example, considering the generic Zeta converter 100-2 or 100-2, one of the switch control signals VH1, VlA or VH2, VL2, can be the oscillating signal Vosc, or a signal in phase with the oscillating signal Vosc, and the other one of the switch control signals can be a logically negated, i.e. in phase opposition version of the oscillating signal Vosc).

According to an embodiment, in each one of the first and second Zeta converters 100-1, 100-2 the first conduction terminal of the respective high-side switch Sh1, Sh2 is electrically coupled (e.g., directly connected) to the input terminal Tin-1, Tin-2 of the Zeta converter.

According to an embodiment, in each one of the first and second Zeta converters 100-1, 100-2 the second conduction terminal of the respective low-side switch Sl1, Sl2 is electrically coupled (e.g., directly connected) to a reference voltage terminal Tref-1, Tref-2 of the Zeta converter, which, in operation, receives a reference voltage GND (for example, 0 V).

According to an embodiment, each one of the first and second Zeta converters 100-1, 100-2 comprises an input stage for receiving (in operation) the input voltage Vdd (at the respective input terminal Tin-1, Tin-2) and an output stage for providing (at the respective output terminal Tout-1, Tout-2) the respective output voltage Vol, Vol (to be delivered to the load RI).

According to an embodiment, in each one of the first and second Zeta converters 100-1, 100-2 the input stage is an inductive input stage, for example comprising an input inductor Li1, Li2.

According to an embodiment, in each one of the first and second Zeta converters 100-1, 100-2 the respective input inductor Li1, Li2 has a first terminal electrically coupled (e.g., directly connected) to the second conduction terminal of the respective high-side switch Sh1, She, and a second terminal electrically coupled (e.g., directly connected) to the respective reference voltage terminal Tref-1, Tref-2.

According to an embodiment, in each one of the first and second Zeta converters 100-1, 100-2 the respective output stage comprises an output inductor L01, L02.

According to an embodiment, in each one of the first and second Zeta converters 100-1, 100-2 the respective output inductor L01, Lot has a first terminal electrically coupled (e.g., directly connected) to the first terminal of the respective low-side switch Sl1, Sl2, and a second terminal electrically coupled (e.g., directly connected) to the respective output terminal Tout-1, Tout-2 of the Zeta converter.

Therefore, in the first Zeta converter 100-1 of the considered exemplary embodiment, when the high-side switch Sh1 is in the ON state, the input voltage Vdd is allowed to be provided to the input stage (input inductor Li1), and with the high-side switch Sh1 in the OFF state the input voltage Vdd is prevented from being provided to the input stage (input inductor Li1). Similarly, in the second Zeta converter 100-2, when the high-side switch Sh2 is in the ON state, the input voltage Vdd is allowed to be provided to the input stage (input inductor Li2), and with the high-side switch Sh1 in the OFF state the input voltage Vdd is prevented from being provided to the input stage (input inductor Li2).

According to an embodiment, the output stage of (one or both of, as in the considered example) the first and second switching converters 100-1, 100-2 comprises (in addition to the respective output inductor Lo1, Lo2) a respective output capacitor Co1, Co2.

According to an embodiment, the output capacitor Co1, Co2 has a first terminal electrically coupled (e.g., directly connected) to the respective output terminal Tout-1, Tout-2 of its Zeta converter 100-1, 100-2 (and, hence, to the second terminal of the respective output inductor Lo1, Lot) and a second terminal electrically coupled (e.g., directly connected) to the respective reference terminal Tref-1, Tref-2 (which, in operation, receives the reference voltage GND).

Therefore, in the first Zeta converter 100-1 of the considered exemplary embodiment, with the low-side switch Sl1 in the ON state the reference voltage GND is allowed to be provided to the output stage, and with the low-side switch Sl1 in the OFF state the reference voltage GND is prevented from being provided to the output stage. Similarly, in the second Zeta converter 100-2, with the low-side switch Sl2 in the ON state the reference voltage GND is allowed to be provided to the Zeta converter output stage, and with the low-side switch Sl2 in the OFF state the reference voltage GND is prevented from being provided to the Zeta converter output stage.

According to an embodiment, in (one or both of) the first and second Zeta converters 100-1, 100-2, a capacitive coupling stage for coupling the input stage and the output stage to each other is provided. According to an embodiment, the capacitive coupling stage comprises a coupling capacitor Cfly1, Cfly2. According to an embodiment, the coupling capacitor Cfly1, Cfly2 has a first terminal electrically coupled (e.g., directly connected) to the first terminal of the respective input inductor Li1, Li2 (and, hence, to the second terminal of the respective high-side switch Sh1, Sh2), and a second terminal electrically coupled (e.g., directly connected) to the first terminal of the respective output inductor Lo1, Lot (and, hence, to the first terminal of the respective low-side switch Sl1, Sl2).

As mentioned above, the switching converter 100 may be used in any electronic system. According to an embodiment, the switching converter 100 is configured to be electrically coupled to one or more modules of such an electronic system. Such modules are conceptually represented in FIG. 1 by an equivalent resistor element Rl (load resistor), having a first terminal electrically coupled (e.g., directly connected) to the output terminal Tout-1 of the first Zeta converter 100-1 and a second terminal electrically coupled (e.g., directly connected) to the output terminal Tout-2 of the second Zeta converter 100-2. Later on, an exemplary application scenario of the switching converter 100 will be described in greater detail.

The switching converter 100 so far disclosed may essentially be regarded as a bridge connection of the two Zeta converters 100-1 and 100-2. The basic relationships describing the operation of the first and second Zeta converters 100-1 and 100-2 are reported here below.

The output voltage Vo1 of the first Zeta converter 100-1 as a function of the input voltage Vdd may be expressed by the following relationship:

$$V_{o1} = V_{dd}\frac{D1}{1-D1}$$

where D1 denotes the duty cycle of the switch control signals VH1, VL1 for the switches Sh1, Sl1.

Similarly, the output voltage Vo2 of the second Zeta converter 100-2 as a function of the input voltage Vdd may be expressed by the following relationship:

$$V_{o2} = V_{dd}\frac{D2}{1-D2}$$

where D2 denotes the duty cycle of the switch control signals VH2, VL2 for the switches Sh2, Sl2.

The voltage Vout across the load Rl is given by:

$$V_{out} = V_{o1} - V_{o2} = V_{dd}\frac{D1}{1-D1} - V_{dd}\frac{D2}{1-D2}$$

The maximum working voltage value Vol1,max of the voltage Vol1 at the first terminal of the output inductor Lo1 (high-side switch Sh1 in the ON state, low-side switch Sl1 in the OFF state), and the minimum working voltage value Vol1,min of the voltage Vol1 at the first terminal of the output inductor Lo1 (high-side switch Sh1 in the OFF state, low-side switch Sl1 in the ON state), may be expressed by the following relationships:

$$V_{ol1,max} = \frac{V_{o1}}{D1} = \frac{V_{dd}}{1-D1}$$

$$V_{ol1,min} = 0$$

The maximum working voltage value Voh1,max of the voltage Voh1 at the first terminal of the input inductor Lin1 (high-side switch Sh1 in the ON state, low-side switch Sl1 in the OFF state), and the minimum working voltage value Voh1,min of the voltage Voh1 at the first terminal of the input inductor Lin1 (high-side switch Sh1 in the OFF state, low-side switch Sl1 in the ON state) may be expressed by the following relationships:

$$V_{oh1,max} = V_{dd}$$

$$V_{oh1,min} = V_{dd} - V_{O,max} = V_{IN} - \frac{V_{IN}}{1-D1}$$

Similar relationships hold for the second Zeta converter 100-2 (replacing the index "1" with the index "2" in the equations).

The output current/out through the load Rl (in the assumption of a resistive load with resistance Rl) may be expressed by the following relationship:

$$I_{OUT} = \frac{V_{out}}{Rl} = V_{o1} - V_{o2} = V_{dd}\frac{D1}{1-D1} - V_{dd}\frac{D2}{1-D2}$$

The average working current $I_{l,avg}$ and maximum working current (peak current) Isl(pk) flowing through the low-side switch Sl1 may be expressed by the following relationships:

$$I_{l,avg} = -\frac{I_{OUT}}{1-D1}(1-D1) = -I_{OUT}$$

$$Isl(pk) = -\frac{I_{OUT}}{1-D1}$$

The average working current $I_{h,avg}$ and the maximum working current (peak current) Ish(pk) flowing through the high-side switch Sh1 may be expressed by the following relationships:

$$I_{h,avg} = I_{OUT}\frac{D1}{1-D1}$$

$$Ish(pk) = -\frac{I_{OUT}}{1-D1}$$

Similar relationships hold for the second Zeta converter 100-2 (replacing the index "1" with the index "2" in the equations).

Considering for example the first Zeta converter 100-1, for values of the duty cycle D1 in the range from 0 and 0.5, the output voltage Vol takes values less than or equal to the input voltage Vdd. For values of the duty cycle D1 higher than 0.5, the output voltage Vol takes values greater than the input voltage Vdd. For a proper functioning of the converter, the value of the duty cycle D1 should not exceed about 0.75. Similar considerations apply to the second Zeta converter 100-2.

In an implementation of the switching converter 100 as an integrated circuit, since the circuit node Voh1 between the high-side switch Sh1 and the input inductor Li1 in the first Zeta converter 100-1 (and, similarly, the circuit node Voh2 between the high-side switch She and the input inductor Lie in the second Zeta converter 100-2) may fall to values below the reference voltage GND (which may induce junction forward biasing if circuit components like the FETs implementing the switches are insulated from the semiconductor substrate by means of pn junctions), Silicon On Insulator (SOI) insulation techniques should be envisaged.

The major criticality for the dissipation of the switching converter 100 is when either the first Zeta converter 100-1 or the second Zeta converter 100-2 or both operate(s) in boost condition (i.e., with duty cycle D1 and/or D2 of the switch control signals VH1, VL1 and/or VH2, VL2 higher than 0.5), during the transient when the voltage at the circuit node Voh1 and/or Voh2 between the high-side switch Sh1 and/or Sh2 and the input inductor Li1 and/or 112, can fall well below the reference voltage GND (of a value equal to the DC input voltage Vdd or more) due to the direction of the current, passes to the maximum positive value. This transition is governed by the switching off of the low-side switch Sl1 and/or Sl2 and the switching on of the high-side switch Sl1 and/or Sl2. In these conditions, the voltage across the high-side switch Sh1 and/or Sh2 is equal to the DC input voltage Vdd plus the (absolute value of the) negative voltage at the Voh1 and/or Voh2 between the high-side switch Sh1 and/or Sh2 and the input inductor Li1 and/or Li2. The DC output voltage V01 and/or V02 starts rising when peak current Ish(pk) flowing through the high-side switch Sh1 and/or Sh2 equals the peak current Isl(pk) flowing through the low-side switch Sl1 and/or Sl2.

Considering that the high-side switch Sh1, Sh2 and the low-side switch Sl1, Sl2 comprise FET transistors (e.g., MOSFETs) 103 that have the intrinsic pn diode 105 across the drain and source electrodes, which intrinsic diode 105 is in forward biasing condition during the transient, due to the reverse recovery time the current that runs through the high-side switch Sh1 and/or Sh2 can, for a period of time, be 2-3 times the peak current Isl(pk) flowing through the low-side switch Sl1 and/or Sl2. This further increases the instantaneous dissipated power.

In practical implementations, the power dissipated by the high-side switch Sh1 and/or Sh2 during this transient can reach 500 W.

In order to reduce the dissipated power, particularly due to the critical transition discussed a few lines above (and, at the same time, reducing the number of electronics/electrical/electro-mechanical components of the system and reduce the total space occupation of the switching converter 100), according to an embodiment of the solution disclosed in this document, pairs of loosely coupled inductors are used to implement the input inductors Li1 and Li2 of the first and second Zeta converters 100-1 and 100-2, and to implement the output inductors L01 and Lot of the first and second Zeta converters 100-1 and 100-2.

The concept of "loosely coupled inductors" is per-se known in the art. By "coupled inductors" (or "magnetically coupled inductors") it is meant a pair of inductors (in the considered example, the pair of input inductors Li1 and Li2 of the first and second Zeta converters 100-1 and 100-2, the pair of output inductors L01 and L02 of the first and second Zeta converters 100-1 and 100-2) that are inductively coupled or magnetically coupled, being configured such that a change in current through one inductor coil (of the coupled inductors) induces a voltage across the ends of the other inductor coil (of the coupled inductors) through electromagnetic induction. In practice, the two inductors of the pair of inductively coupled or magnetically coupled inductors may share the same magnetic core. The amount of inductive coupling between the two inductors is measured by their mutual inductance and can be expressed by a coupling coefficient k. Considering two inductors with respective inductances ("self inductances") equal to L1 and L2 and magnetically coupled with a coupling coefficient k, the mutual inductance M is equal to:

$$M = k\sqrt{L1L2}$$

If the two inductances L1 and L2 of the two magnetically coupled inductors coincide (L1=L2=L), then the mutual inductance M is equal to kL. The common mode inductance Lcm of the magnetically coupled inductors is equal to Lcm=L+L*k. The differential mode inductance Ldm of the magnetically coupled inductors is equal to Ldm=L−L*k.

The inductors of the pair of inductively coupled or magnetically coupled inductors are said to be "loosely coupled" when the coupling coefficient k is less than approximately 1, for example 0.7.

For example, with two magnetically coupled inductors of same inductance L=2.2 µH and coupled with a coupling coefficient k=0.7, the common mode inductance Lcm is equal to 3.74 µH and the differential mode inductance Ldm is equal to 0.66 µH.

According to an embodiment of the solution disclosed in this document, and as schematized in FIG. 1 by lines denotes as Li1-Li2 and L01-L02, the input inductors Li1 and Li2 of the first and second Zeta converters 100-1 and 100-2 are loosely coupled, and the output inductors L01 and L02 of the first and second Zeta converters 100-1 and 100-2 are loosely coupled. In particular, the coupling Li1-Li2 of the input inductors Li1 and Li2 of the first and second Zeta converters 100-1 and 100-2 is such that (as indicated by the "dot convention" in the circuit diagram) when current enters the dotted terminal of the input inductor Li1 that is connected to the high side switch Sh1 of the first Zeta converter 100-1, the voltage induced by the coupled current is positive at the dotted terminal of the input inductor Li2 connected to the high side switch She of the second Zeta converter 100-2. The coupling L01-L02 of the output inductors L01 and L02 of the first and second Zeta converters 100-1 and 100-2 is such that (as also indicated by the "dot convention" in the circuit diagram) if current enters the dotted terminal of the output inductor L01 that is connected to the output terminal Tout-1 of the first Zeta converter 100-1, the voltage induced by the coupled current is positive at the dotted terminal of the output inductor L02 connected to the output terminal Tout-2 of the second Zeta converter 100-2.

Figure 4:
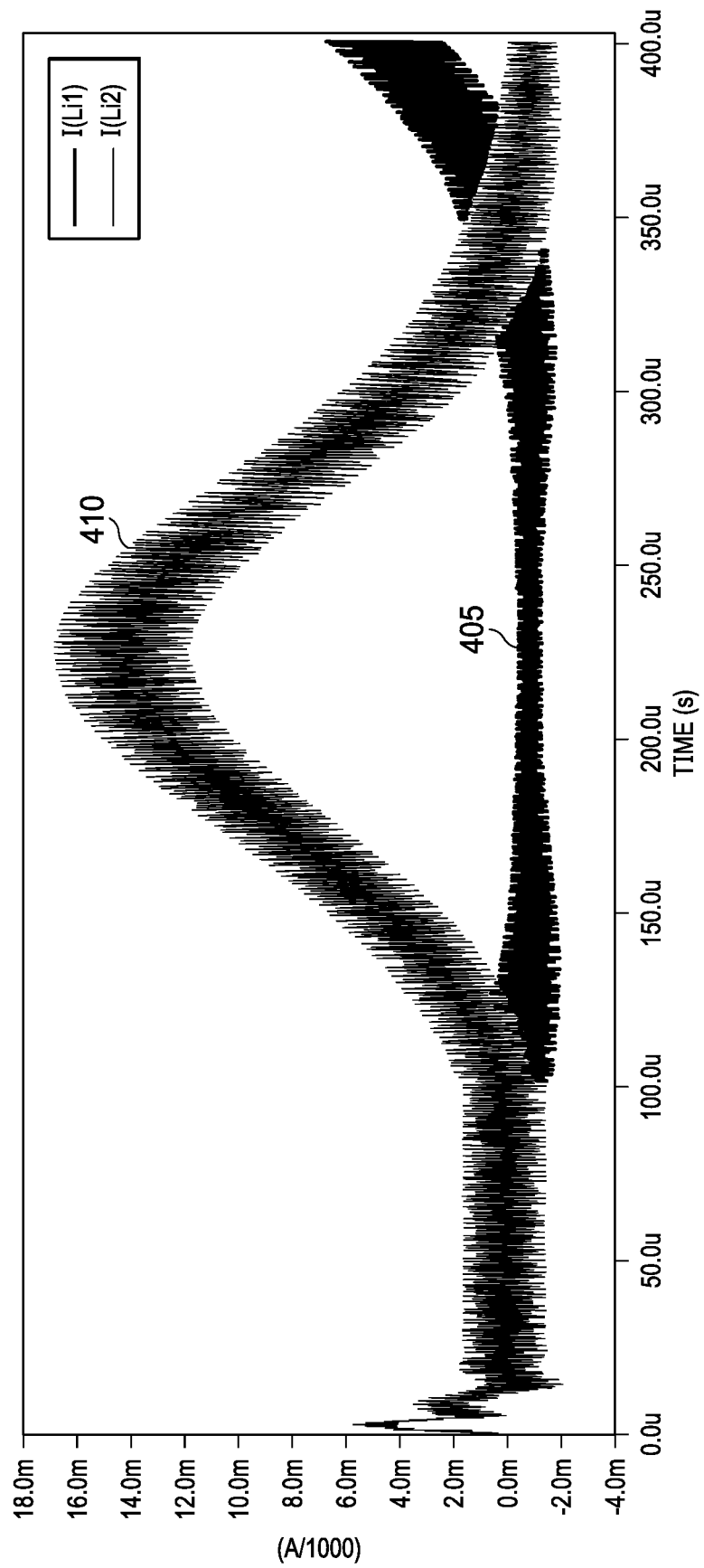
FIG. 4 is a comparative diagram showing curves of currents flowing through input inductors of the two Zeta converters of FIG. 1, resulting from simulations.

FIG. 3 and FIG. 4 are diagrams of currents, resulting from simulations of a circuit like that of FIG. 1.

In particular, FIG. 3 is a diagram showing, as a result of simulations, the currents flowing through the output inductors L01 (curve 305) and L02 (curve 310) of the first and second Zeta converters 100-1 and 100-2 (the diagram of FIG. 3 has time in abscissa, in μsec, and current in ordinate, in Amperes/moo). It can be seen that the low-frequency currents flowing through the output inductors L01 (curve 305) and Lot (curve 310) are substantially equal and of opposite direction. This means that by implementing the output inductors L01 and Lot of the first and second Zeta converters 100-1 and 100-2 as magnetically coupled inductors (sharing a same magnetic core) and properly oriented, the magnetic flux tends to zero. As a consequence, the inductance is reduced.

The high-frequency modulation of the oscillating signal Vosc (and of the switch control signals VH1, Vl1, Vh2, Vl2) can be done in such a way that, in the absence of signals, the ripple currents are in the same direction (common mode). This determines an increase of the effective inductance (for the in-phase ripple) with respect to the nominal inductance.

FIG. 4 is a diagram showing the currents flowing through the input inductors Li1 (curve 405) and Li2 (curve 410) of the first and second Zeta converters 100-1 and 100-2 (as in the diagram of FIG. 3, time is in abscissa, in μsec, and current in ordinate, in Amperes/woo). It can be seen that the currents, at low frequency, are not equal and opposite, being instead alternated: when a relatively high current is flowing through one of the two input inductors Li1, Li2, the current flowing through the other input inductor is very low. This means that, by using magnetically coupled inductors for the input inductors Li1 and Li2, it is possible to reduce (almost halve) the space occupation of the two input inductors Li1 and Li2, compared to if the two input inductors were implemented as magnetically separated, not coupled inductors, with two distinct magnetic cores. As to the ripple current, a result similar to that exhibited by the output inductors is found.

In quiescent condition (by quiescent condition it is meant a condition in which the switching converter 100 is operating—i.e., with the high side switches and the low side switches switching—but in absence of a low-frequency signal modulating the duty cycle of the switch control signals VH1, VL1, VH2, VL2; in this condition, the differential mode output voltage and the output current are essentially zero) the reduction of the ripple current due to the increased inductance (of the magnetically coupled inductors with respect to the case of inductors that are not magnetically coupled) can reduce the quiescent current (by quiescent current it is meant the current drained by the switching converter 100 from the source of the DC input voltage Vdd in the quiescent condition defined a few lines above, i.e. without output signal) and the ripple on the output voltage V01, V02.

Hereinbelow, a comparison in terms of saturation currents and necessary number of inductors between a system employing isolated, not magnetically coupled inductors and, instead, magnetically coupled inductors is reported. By saturation current it is meant the value of the current flowing through the inductor for which the inductance of the inductor falls of a 10% from the inductance of the inductor when the latter is run through by lower currents (as known, the inductance value of an inductor remains essentially constant at its nominal value until the magnetic field generated by the current flowing through the inductor saturates the magnetic core; above that current value, the inductor's inductance begins to fall). The example refers to a switching converter like that shown in FIG. 1 with a value of the DC input voltage Vdd of 14.4 V, a load Rl with resistance of 4 Ohms, a peak voltage of +/−24V.

| Isolated inductors | Magnetically coupled inductors |
|---|---|
| Li1: 1 μH, Isat~15 A | Li1 + Li2 = 1 + 1 μH, |
| Li2: 1 μH, Isat~15 A | Isat~15 A(7.5 A + 7.5 A) |
| Lo1: 2.2 μH, Isat~6 A | Lo1 + Lo2 = 2.2 + 2.2 μH, |
| Lo2: 2.2 μH, Isat~6 A | Isat~4 A (2 A + 2 A) |

It appears that by exploiting the properties of magnetically coupled inductors, and by properly coupling the pair of input inductors of the input stages and the pair of output inductors of the output stages of the first and second Zeta converters (where, by "properly coupling" it is meant coupling the two inductors of the magnetically coupled inductor pairs so as to respect a specific polarity, as defined in the foregoing), it is possible to achieve performances equal to or better than those achievable with separated (i.e., not magnetically coupled) inductor pairs, and with a significantly reduced space occupation. Taking into account the fact that a pair of magnetically coupled inductors is sold as a single component, the use of pair of magnetically coupled conductors also reduces the number of components of the switching converter. Additionally, the necessary saturation currents are significantly reduced.

Additionally, by using magnetically coupled inductors for the input inductors Li1, Li2, and for same or similar duty cycles D1 and D2 of the control signals Vh1, Vl1 and Vh2, Vl2, the trends of the currents flowing through the input inductors Li1, Li2 allow a lower power dissipation in the critical phase, when, for currents higher than the ripple current, the one among the first and second Zeta converters 100-1, 100-2 that is in boost condition switches causing the potential at node Vol to pass from the low voltage state ("L") to the high voltage state ("H"), close to the value of the DC input voltage Vdd.

This working zone is critical due to the reverse recovery charge of the intrinsic diodes 105 intrinsically associated with the FETs 103 that implement the switches Sh1, She, Sl1 and Sl2.

To allow the potential at node V01 make the abovementioned transition the current flowing through the high side switch Sh1 has to be greater than the current flowing through the low side switch Sl1 (which in the meantime has been switched to the open state and in which current continues flowing through the associated intrinsic diode 105). Such a current is the sum of the current flowing through the output inductor L01 and the current flowing through the input inductor Li1, this latter current being substantially greater than the former current. The current flowing through the input inductor Li1 is therefore determining the power dissipated upon switching of the high side switch Sh1.

Similar considerations hold true for the second Zeta converter 100-2.

Figure 5:
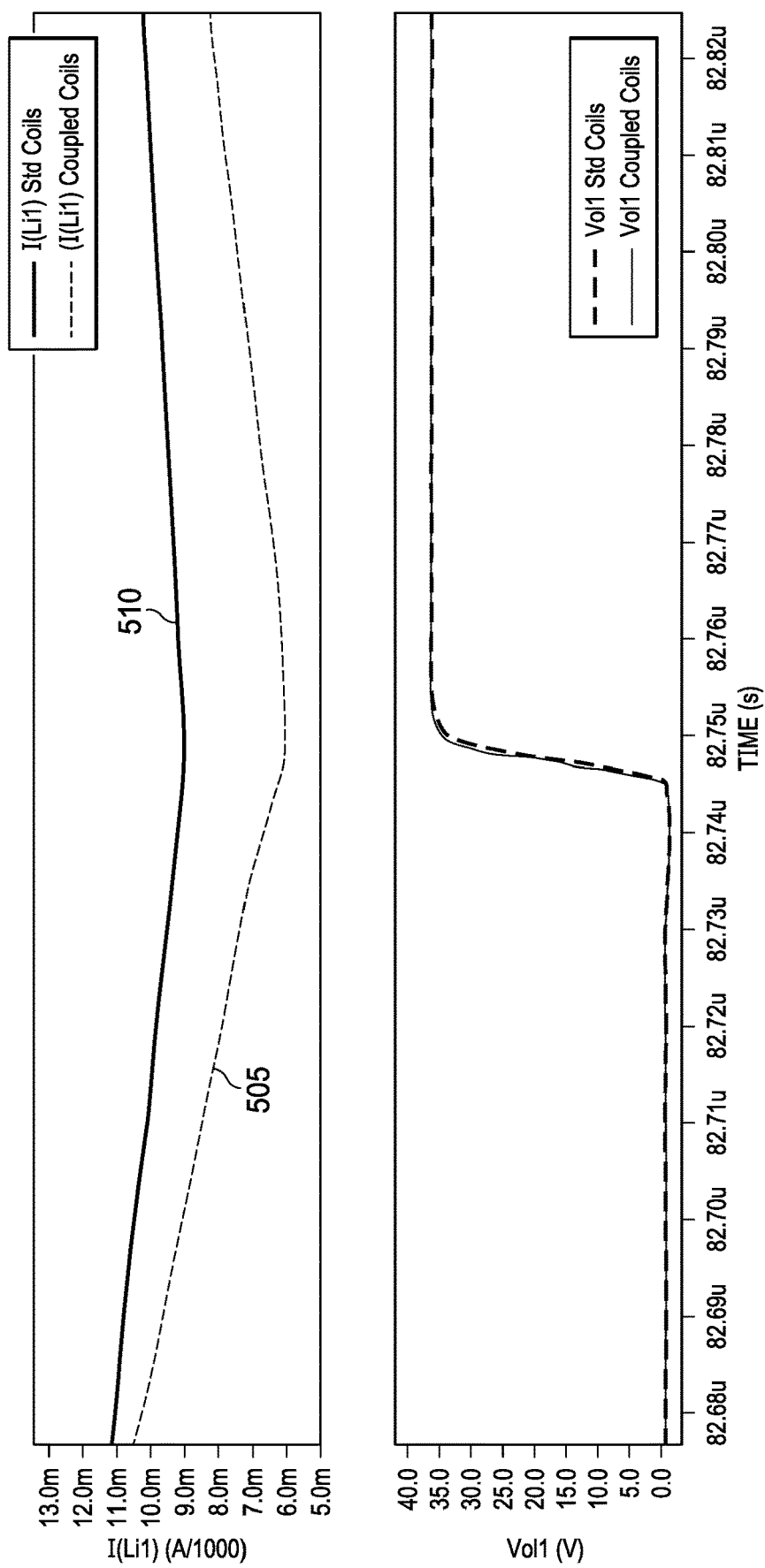
FIGS. 5 and 6 are comparative diagrams showing curves of currents and power dissipation as a function of output power with and without adopting the solution proposed in the present disclosure.
Figure 6:
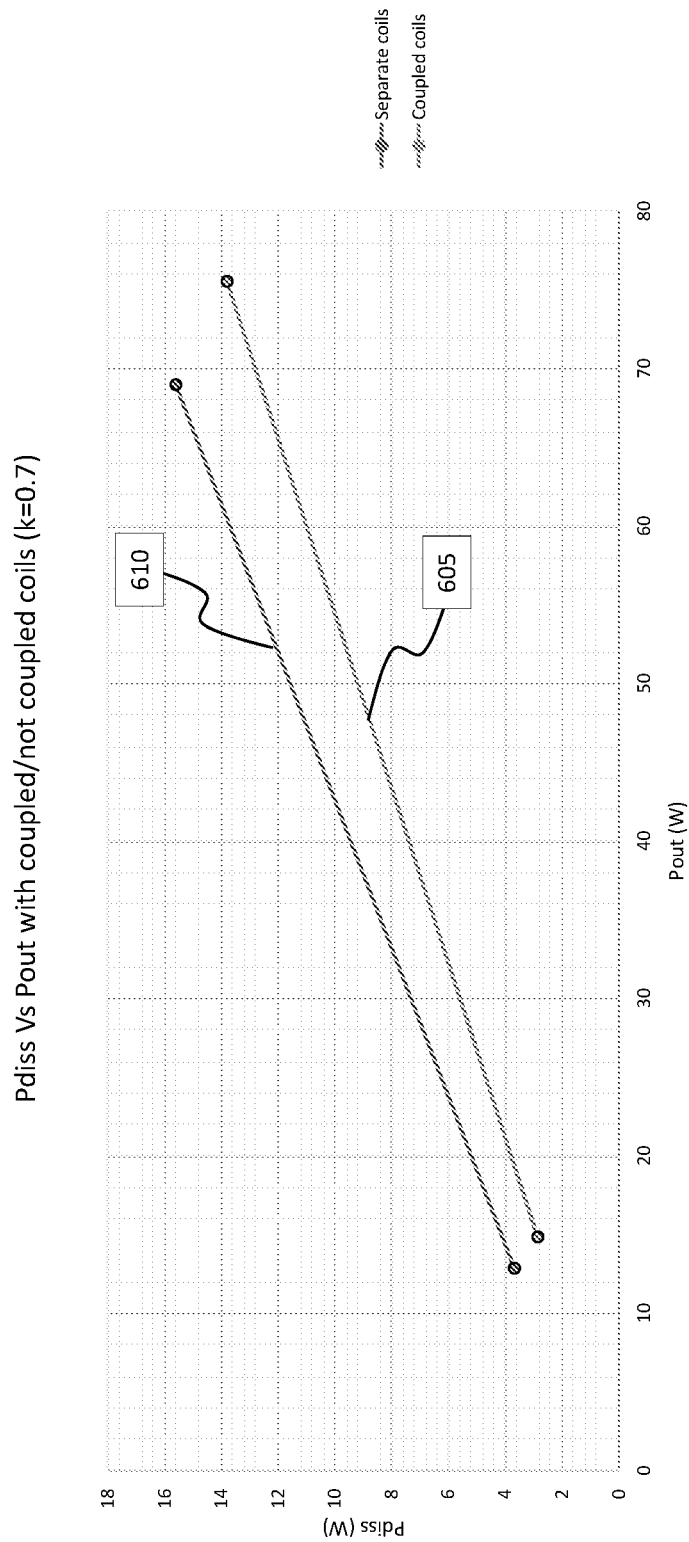

FIG. 5 is a diagram (time in abscissa, in μsec, current in ordinate, in Amperes/woo) showing the currents flowing through the input inductor Li1 (and that also flows through the FET 103 of the low-side switch Sl1) in such critical working zone, in the case of magnetically coupled inductors (curve 505) compared to the case of isolated, not magnetically coupled inductors (curve 510). As can be deduced observing also FIG. 6 (a diagram showing time in abscissa, in μsec, and in ordinate the values of the voltages at the nodes Vol1 and Vol2), the dissipated power is significantly reduced—as shown in the diagram of FIG. 6, depicting in abscissa the output power Pout and in ordinate the dissipated power Pdiss (both the output power Pout and the dissipated power Pdiss are expressed in Watts), in the case of magnetically coupled inductors (curve 605) compared to the case of isolated, not magnetically coupled inductors (curve 610). In other words, by exploiting magnetically coupled inductors for the input inductors L11, Lie of the first and second Zeta converters 100-1 and 100-2, the shape of the current flowing through the input inductor Li1 is such that, during the transient of the potential of the node V01 from "L" to "H", the current value is substantially lower than the value it would take should the inductors be not magnetically coupled, so that the dissipated power is significantly reduced.

When the output current is zero, with the first and second Zeta converters 100-1, 100-2 modulated in phase (i.e., with the switch control signals Sh1 and Sh1 in phase with each other, and the switch control signals Sl1 and Sl2 in phase with each other and in phase opposition with respect to the switch control signals Sh1 and Sh1), the current flowing through the pairs of magnetically coupled inductors (input inductors and output inductors) Li1, Li2, and L01, L02 are in phase, and this increases the effective inductance and a reduction of the ripple current. The result is a reduction of the quiescent current.

Without losing generality, the switching converter 100 may be used in any electronic system comprising a power source (such as a battery pack, or a battery tank of photovoltaic cells) and one or more electronic/electrical/electromechanical components each one operating at a respective voltage: in such an electronic system the switching converter boo may be configured to generate multiple controlled output voltages from a single input voltage provided by the power source (thus saving space, in that the use of multiple power sources within the electronic system to supply different components thereof is avoided). Examples of such an electronic system include a battery charger or an audio power amplifier.

Figure 7:
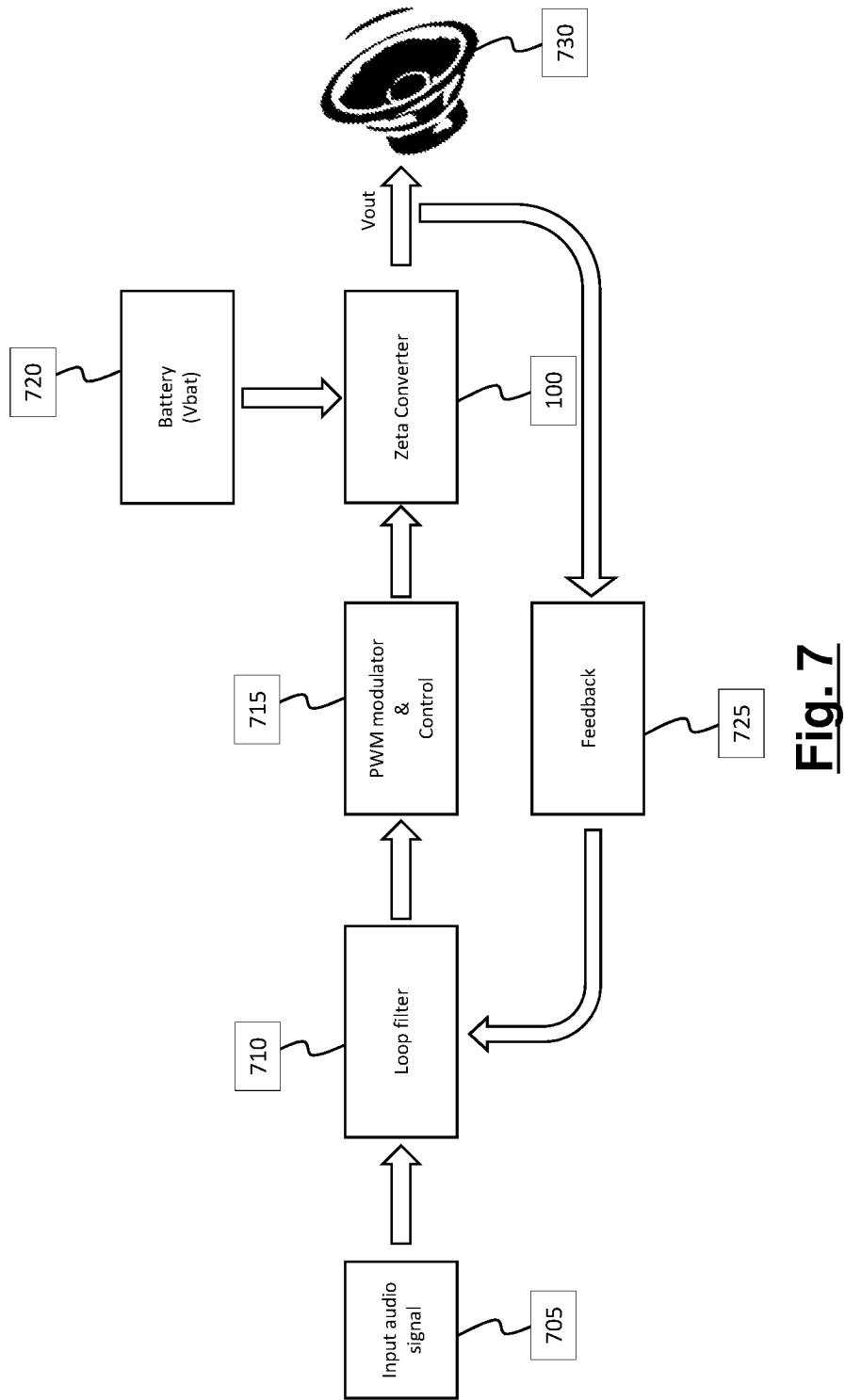
FIG. 7 is a functional block diagram of an exemplary practical application of the solution in accordance to an embodiment of the present disclosure.

FIG. 7 is a functional block diagram of an exemplary practical application of the solution in accordance to an embodiment of the present disclosure. The exemplary system depicted in FIG. 7 is an audio electronic system. In particular, an input audio signal 705 is fed to a loop filter 710. The signal filtered by the loop filter 710 is fed to a pulse-width modulator (PWM) and controller 715 that controls a Zeta converter boo like that depicted in FIG. 1 (in this assumption, the controllers 107-1 and 107-2 shown in FIG. 1 as part of the Zeta converter boo can be assumed to be part of the controller 715 (in which case the switch control signals SH1, SL1, SH2, SL2 can be generated by the controller 715), or the controller 715 can be assumed to generated the PWM oscillating signal Vosc depicted in FIG. 1). The Zeta converter boo, receiving the input DC voltage from e.g. a battery 720, drives a loudspeaker 730. A feedback 730 between the output voltage Vout of the Zeta converter 100 and the loop filter 710 is also shown.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. An audio electronic system comprising:
a loop filter configured to receive and filter an input audio signal;
a pulse-width modulator (PWM) and controller coupled to the loop filter and configured to:
receive the filtered input audio signal; and
control a switching converter;
a battery configured to provide a DC input voltage;
the switching converter, coupled to the battery and to the PWM and controller, the switching converter comprising:
first and second Zeta converters having respective output terminals configured to be connected across a load, each the first and second Zeta converters comprising:
an output stage comprising a respective output inductor, and configured to provide a respective DC output voltage to the load;
a first switching stage configured to be switched between a first state in which the DC input voltage is allowed to be provided to an input stage, and a second state in which the DC input voltage is prevented from being provided to the input stage;
a second switching stage configured to be switched between the first state in which a reference voltage is allowed to be provided to the output stage, and the second state in which the reference voltage is prevented from being provided to the output stage; and
the input stage, configured to receive the DC input voltage and comprising an input inductor having a first terminal electrically coupled to the first switching stage;
wherein the input inductors of the input stages of the first and second Zeta converters are magnetically coupled to each other such that in response to a first current entering the first terminal of the input inductor of the first Zeta converter that is coupled to the first switching stage of the first Zeta converter, a first voltage induced by the first current is positive at the first terminal of the input inductor of the second Zeta converter that is coupled to the first switching stage of the second Zeta converter; and
wherein the output inductors of the output stages of the first and second Zeta converters are magnetically coupled to each other such that in response to a second current entering a terminal of the output inductor of the first Zeta converter that is coupled to the output terminal of the first Zeta converter, a second voltage induced by the second current is positive at the terminal of the output inductor that is coupled to the output terminal of the second Zeta converter; and a loudspeaker coupled to the output stages of the first and second Zeta converters and configured to be driven by the respective DC output voltages.

2. The audio electronic system according to claim 1, further comprising a feedback coupled between the respective DC output voltages of the first and second Zeta converters and the loop filter.

3. The audio electronic system according to claim 1, wherein the PWM and controller is configured to generate switch control signals to control the first and second switching stages.

4. The audio electronic system according to claim 1, wherein:
the PWM and controller is configured to generate a PWM oscillating signal; and
the first and second Zeta converters comprise respective switch controllers configured to receive the PWM oscillating signal and generate switch control signals to control the first and second switching stages.

5. The audio electronic system according to claim 1, wherein the output inductors of the output stages of the first and second Zeta converters are loosely magnetically coupled inductors.

6. The audio electronic system according to claim 5, wherein the loosely magnetically coupled inductors have a coupling coefficient of less than 1.

7. The audio electronic system according to claim 1, wherein the load comprises a class D audio power amplifier.

8. The audio electronic system according to claim 1, wherein the input inductors of the input stages of the first and second Zeta converters are loosely magnetically coupled inductors.

9. The audio electronic system according to claim 8, wherein the loosely magnetically coupled inductors have a coupling coefficient of less than 1.

10. The audio electronic system according to claim 1, wherein the first switching stage and the second switching stage of the first and second Zeta converters comprise field effect transistors (FETs).

11. An audio electronic system comprising:
a loop filter configured to receive and filter an input audio signal;
a pulse-width modulator (PWM) and controller coupled to the loop filter and configured to:
receive the filtered input audio signal; and
control first and second switching stages of a switching converter;
a battery configured to provide a DC input voltage;
the switching converter, coupled to the battery and to the PWM and controller, the switching converter comprising:
first and second Zeta converters having respective output terminals configured to be connected across a load, each the first and second Zeta converters comprising:
an output stage comprising a respective output inductor, and configured to provide a respective DC output voltage to the load;
a first switching stage configured to be switched between a first state in which the DC input voltage is allowed to be provided to an input stage, and a second state in which the DC input voltage is prevented from being provided to the input stage;
a second switching stage configured to be switched between the first state in which a reference voltage is allowed to be provided to the output stage, and the second state in which the reference voltage is prevented from being provided to the output stage; and
the input stage, configured to receive the DC input voltage and comprising an input inductor having a first terminal electrically coupled to the first switching stage;
wherein the input inductors of the input stages of the first and second Zeta converters are magnetically coupled to each other such that in response to a first current entering the first terminal of the input inductor of the first Zeta converter that is coupled to the first switching stage of the first Zeta converter, a first voltage induced by the first current is positive at the first terminal of the input inductor of the second Zeta converter that is coupled to the first switching stage of the second Zeta converter; and
wherein the output inductors of the output stages of the first and second Zeta converters are magnetically coupled to each other such that in response to a second current entering a terminal of the output inductor of the first Zeta converter that is coupled to the output terminal of the first Zeta converter, a second voltage induced by the second current is positive at the terminal of the output inductor that is coupled to the output terminal of the second Zeta converter;
a feedback coupled between the respective DC output voltages of the first and second Zeta converters and the loop filter; and
a loudspeaker coupled to the output stages of the first and second Zeta converters and configured to be driven by the respective DC output voltages.

12. The audio electronic system according to claim 11, wherein:
the PWM and controller is configured to generate a PWM oscillating signal; and
the first and second Zeta converters comprise respective switch controllers configured to receive the PWM oscillating signal and generate switch control signals to control the first and second switching stages.

13. The audio electronic system according to claim 11, wherein the output inductors of the output stages of the first and second Zeta converters are loosely magnetically coupled inductors.

14. The audio electronic system according to claim 13, wherein the loosely magnetically coupled inductors have a coupling coefficient of less than 1.

15. The audio electronic system according to claim 11, wherein the load comprises a class D audio power amplifier.

16. The audio electronic system according to claim 11, wherein the input inductors of the input stages of the first and second Zeta converters are loosely magnetically coupled inductors.

17. The audio electronic system according to claim 16, wherein the loosely magnetically coupled inductors have a coupling coefficient of less than 1.

18. The audio electronic system according to claim 11, wherein the first switching stage and the second switching stage of the first and second Zeta converters comprise field effect transistors (FETs).

* * * * *